US006884686B2

United States Patent
Pendharkar

(10) Patent No.: US 6,884,686 B2
(45) Date of Patent: Apr. 26, 2005

(54) METHOD OF MANUFACTURING AND STRUCTURE OF SEMICONDUCTOR DEVICE WITH FLOATING RING STRUCTURE

(75) Inventor: Sameer P. Pendharkar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/691,196

(22) Filed: Oct. 22, 2003

(65) Prior Publication Data

US 2004/0079975 A1 Apr. 29, 2004

Related U.S. Application Data

(62) Division of application No. 10/155,543, filed on May 24, 2002, now Pat. No. 6,670,685.

(51) Int. Cl.[7] .............................................. H01L 21/336
(52) U.S. Cl. ....................................... 438/291; 438/298
(58) Field of Search ............................ 257/314, 344, 257/356, 401, 409; 438/140, 197, 217, 262, 289, 291, 298

(56) References Cited

U.S. PATENT DOCUMENTS

| | | | | |
|---|---|---|---|---|
| 5,646,431 A | * | 7/1997 | Hsu et al. ................... | 257/342 |
| 6,222,235 B1 | * | 4/2001 | Kojima et al. ............... | 257/355 |
| 6,448,625 B1 | * | 9/2002 | Hossain et al. .............. | 257/493 |
| 2002/0098637 A1 | * | 7/2002 | Hossain et al. .............. | 438/200 |
| 2003/0001216 A1 | * | 1/2003 | de Fresart et al. .......... | 257/409 |
| 2003/0190789 A1 | * | 10/2003 | Salama et al. ............... | 438/286 |

* cited by examiner

Primary Examiner—Carl Whitehead, Jr.
Assistant Examiner—Jennifer M. Dolan
(74) Attorney, Agent, or Firm—Peter K. McLarty; W. James Brady, III; Frederick J. Telecky, Jr.

(57) ABSTRACT

A high voltage semiconductor device includes a drain region disposed within a semiconductor substrate. The semiconductor device further includes a field oxide layer disposed outwardly from the drain region of the semiconductor substrate. The semiconductor device also includes a floating ring structure disposed inwardly from at least a portion of the field oxide layer. In one particular embodiment, a device parameter degradation associated with the semiconductor device comprises one (1) percent or less after approximately five hundred (500) seconds of accelerated lifetime operation.

7 Claims, 3 Drawing Sheets

METHOD OF MANUFACTURING AND STRUCTURE OF SEMICONDUCTOR DEVICE WITH FLOATING RING STRUCTURE

This application is a divisional of application Ser. No. 10/155,543, filed May 24, 2002 U.S. Pat. No. 6,670,685.

TECHNICAL FIELD OF THE INVENTION

This invention relates generally to semiconductor devices and, more specifically, to a semiconductor device with a floating ring structure and a method of manufacturing the same.

OVERVIEW

Many high power applications require the use of high voltage semiconductor devices, such as drain extended metal oxide semiconductors (DEMOS). Certain important characteristics of a DEMOS include its on-state resistance, its breakdown voltage, and its robustness. Operation of conventional high voltage semiconductor devices typically results in significant design parameter degradation in a relatively short period of time. To counteract this design parameter degradation, conventional devices require over-design of the semiconductor device to meet the desired operational characteristics over the complete lifetime of the device.

SUMMARY OF EXAMPLE EMBODIMENTS

The present invention provides an improved apparatus and method for minimizing degradation of high voltage semiconductor device parameters without compromising the off-state breakdown and on-state resistance of the device. In accordance with the present invention, an apparatus and method for minimizing degradation of high voltage semiconductor device parameters is provided that reduce or eliminate at least some of the shortcomings associated with prior approaches.

In one embodiment, a high voltage semiconductor device comprises a drain region disposed within a semiconductor substrate. The semiconductor device further comprises a field oxide layer disposed outwardly from the drain region of the semiconductor substrate. The semiconductor device also comprises a floating ring structure disposed inwardly from at least a portion of the field oxide layer. In one particular embodiment, a device parameter degradation associated with the semiconductor device comprises one (1) percent or less after approximately five hundred (500) second of accelerated lifetime operation. In this example, device parameter degradation after approximately five hundred (500) seconds of accelerated lifetime operation is approximately equivalent to a greater than 10 year lifetime during normal device operation.

In another embodiment, a high voltage semiconductor device comprises a drain region disposed within a semiconductor substrate. The semiconductor device further comprises a gate oxide layer disposed outwardly from a semiconductor substrate. The semiconductor device also comprises a field oxide layer disposed outwardly from the drain region of the semiconductor substrate. The semiconductor device further comprises a floating ring structure disposed inwardly from at least a portion of the field oxide layer and operable to divert current from the gate oxide layer. In one particular embodiment, during operation the semiconductor device operates at a voltage higher than the gate oxide can normally withstand without incurring damage.

In a method embodiment, a method of forming a semiconductor device comprises forming a drain region within a semiconductor substrate. The method further comprises forming a field oxide layer disposed outwardly from the drain region. The method also comprises forming a floating ring structure disposed inwardly from at least a portion of the field oxide layer. In one particular embodiment, the floating ring structure comprises a first dopant type that is substantially complimentary to a second dopant type used to form the drain region.

Depending on the specific features implemented, particular embodiments of the present invention may exhibit some, none, or all of the following technical advantages. Various embodiments minimize degradation to the semiconductor device parameters due to hot carrier injection. Some embodiments may improve on-state breakdown voltage, while maintaining a relatively high off-state breakdown voltage and a desirable on-state resistance.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of the present invention, and for further features and advantages thereof, reference is now made to the following description taken in conjunction with the accompanying drawings, in which.

DETAILED DESCRIPTION OF EXAMPLE EMBODIMENTS

Figure 1:
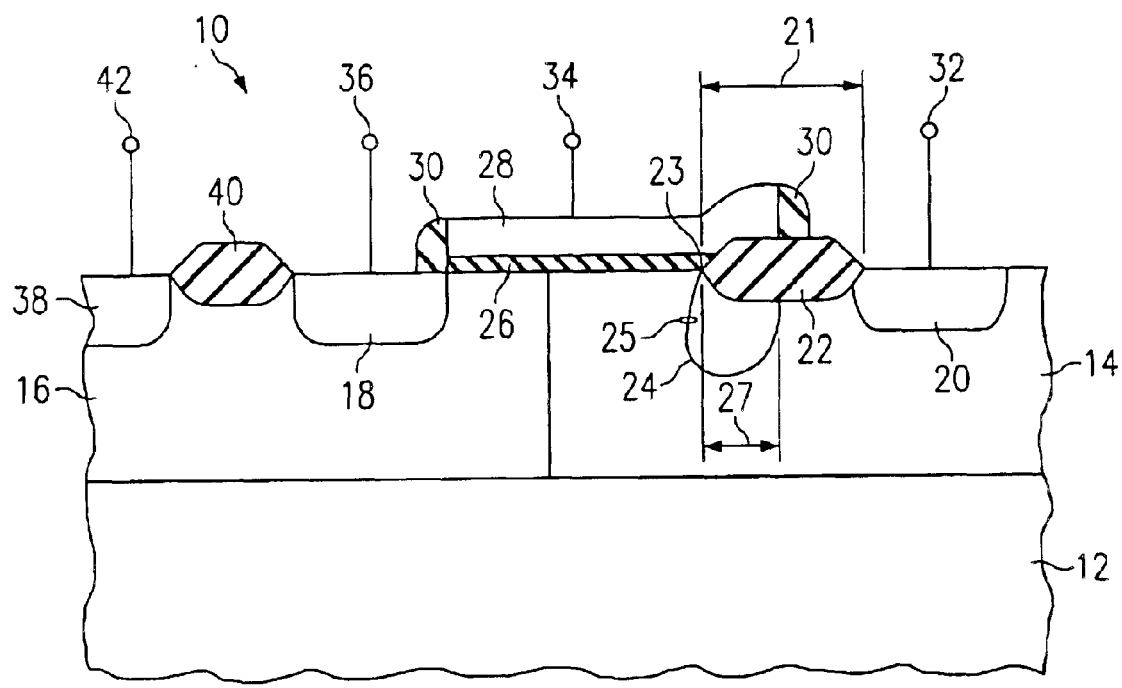
FIG. 1 is a cross-sectional view of a portion of a semiconductor device constructed in accordance with the present disclosure.

FIG. 1 is a cross-sectional view of a portion of a semiconductor device 10 constructed in accordance with the present disclosure. Semiconductor device 10 may comprise any high voltage semiconductor device, such as a drain extended metal oxide semiconductor (DEMOS) of negative-type (DENMOS) or a DEMOS of positive-type (DEPMOS). As used throughout this document, the term "high voltage semiconductor device" refers to a semiconductor device that operates at a voltage higher than the gate oxide can normally withstand without incurring significant damage. For example, if the gate oxide can normally withstand five volts without incurring damage, then any device that operates above five volts with that gate oxide comprises a high voltage device.

Semiconductor device 10 typically resides on a semiconductor substrate 12. Semiconductor device 10 generally includes a drain region 14 and a backgate region 16 formed within semiconductor substrate 12. In addition, semiconductor device 10 also includes a source implant 18 disposed within backgate region 16 and a drain implant 20 disposed within drain region 14. Semiconductor device 10 further includes a semiconductor gate 28 disposed outwardly from semiconductor substrate 12 and a gate oxide layer 26 disposed between substrate 12 and semiconductor gate 28. Semiconductor device 10 also includes a field oxide layer 22 disposed outwardly from drain region 14 and a field oxide layer 40 disposed outwardly from backgate region 16.

In one particular embodiment, semiconductor device 10 includes a floating ring structure 24 disposed inwardly from at least a portion of field oxide layer 22. As used throughout this document, the term "floating ring" refers to an implanted region within a semiconductor substrate that is substantially free from an external electrical connection. Floating ring structure 24 comprises a substantially complementary type of implant region than the type of implant used to form drain region 14. For example, where drain region 14 comprises a primarily negative-type (N-type) implant, floating ring structure 24 would comprise a primarily positive-type (P-type) implant.

In one particular example, a first side 25 of floating ring structure 24 is aligned approximately edge on to an edge 23 of field oxide layer 22 that is disposed adjacent to gate oxide layer 26. In that example, floating ring structure 24 comprises a floating ring width 27 of approximately forty (40) percent of a field oxide width 21. As used throughout this document, the term "approximately edge on" refers to a misalignment between first side 25 and edge 23 where no more than twenty-five (25) percent of floating ring width 27 is disposed inwardly from gate oxide layer 26. In this particular example, where floating ring width 27 comprises 800 angstroms, no more than 200 angstroms of floating ring width 27 is disposed inwardly from gate oxide layer 26 where floating ring structure 24 is aligned approximately edge-on with edge 23 of field oxide layer 22.

In another embodiment, floating ring structure 24 can be aligned within two levels of misalignment. As used throughout this document, the term "level of misalignment" refers to a process of aligning a structure being formed in the current process step to a structure formed in a preceding process step. For example, where drain region 14 was formed two process steps before the current process step and floating ring structure is being formed in the current process step, aligning floating ring structure 24 to drain region 14 enables floating ring structure 24 to be aligned within two levels of misalignment. In one particular example, floating ring structure 24 can be aligned within one level of misalignment.

In various embodiments, semiconductor device 10 also includes spacer structure 30 disposed adjacent to semiconductor gate 28. In some embodiments, semiconductor device 10 includes a drain contact 32, a gate contact 34, and a source contact 36. In other embodiments, semiconductor device 10 may include a back gate implant 38, an isolation structure 40, and a back gate contact 42.

Operation of conventional high voltage semiconductor devices typically results in device parameter degradation in a relatively short period of time. For example, in a high voltage semiconductor device with a thirty-seven (37) volt breakdown voltage and a 0.4 milli-ohm-cm$^2$ on-state resistance, the on-state resistance will typically degrade approximately 25–40% in approximately 300–500 seconds under extreme stress used in accelerated lifetime test. In this example, device parameter degradation in 300–500 seconds under accelerated lifetime testing is approximately equivalent to a less than 10 year lifetime during normal device operation. To counteract device parameter degradation, conventional devices often require overdesign of the semiconductor device to meet the desired operational characteristics over the device lifetime.

Unlike conventional high voltage semiconductor devices, semiconductor device 10 comprises floating ring structure 24. The presence of floating ring structure 24 improves both the electrical safe operating area (SOA) and the lifetime SOA when compared to conventional high voltage semiconductor devices with no floating ring structure. Improvement of the electrical SOA depends at least in part on an improved on-state breakdown voltage and maintaining a relatively high off-state breakdown voltage.

In this particular embodiment, semiconductor drain region 14 overlaps a larger portion of semiconductor gate 28 than the drain region of a conventional high voltage semiconductor device overlaps its respective semiconductor gate. In various embodiments, drain region 14 can overlap thirty (30) percent or more of the length of semiconductor gate 28. For example, drain region 14 can overlap thirty-five (35) percent or more, forty (40) percent or more, or forty-five (45) percent of the length of semiconductor gate 28. The improved on-state breakdown voltage of semiconductor device 10 depends at least in part on this increased overlap between semiconductor gate 28 and drain region 14.

Semiconductor device 10 is capable of maintaining a relatively high breakdown voltage even with the increased overlap between semiconductor gate 28 and drain region 14. This results because floating ring structure 24 substantially depletes during off-state operation of semiconductor device 10. In addition, the increased overlap is advantageous in reducing the on-state resistance of semiconductor device 10, which aids in minimizing conduction losses within device 10.

The improved lifetime SOA depends at least in part on the reduced degradation to the semiconductor device parameters due to hot carrier injection. The reduction in device parameter degradation due to hot carrier injection depends at least in part on the combined affects of impact ionization and current flow occurring deeper within semiconductor device 10. Floating ring structure 24 operates to divert current flow away from gate oxide layer 26. This, in turn, results in impact ionization occurring deeper within semiconductor device 10 and also results in current flow that is deeper within device 10. In some embodiments, device parameter degradation can be, for example, one (1) percent or less in approximately five hundred (500) seconds of accelerated lifetime testing. In these embodiments, device parameter degradation after approximately five hundred (500) seconds of accelerated lifetime operation is approximately equivalent to a greater than 10 year lifetime during normal device operation. In other embodiments, device parameter degradation can be, for example, one-tenth (0.1) percent or less in approximately five hundred (500) seconds of accelerated lifetime testing. In these embodiments, device parameter degradation after approximately five hundred (500) seconds of accelerated lifetime operation is approximately equivalent to a greater than 10 year lifetime during normal device operation.

The reduced device parameter degradation can also result in an improvement to the robustness of semiconductor device 10. The improvement to the robustness of semiconductor device 10 depends at least in part on the ability of floating ring structure 24 to divert the impact ionization and current away from gate oxide layer 26.

Figure 2:
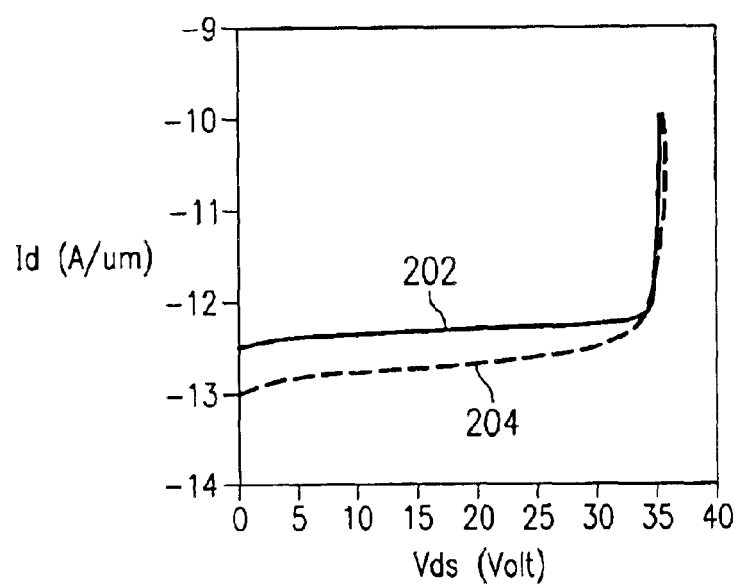
FIG. 2 is a graph comparing the off-state breakdown voltage of a high voltage semiconductor device with a floating ring structure to a high voltage semiconductor device without a floating ring structure.

FIG. 2 is a graph comparing the off-state breakdown voltage of a high voltage semiconductor device with a floating ring structure to a high voltage semiconductor device without a floating ring structure. In this example, line 202 represents the off-state breakdown voltage of a high voltage semiconductor device with a floating ring structure. Line 204 represents the off-state breakdown voltage of a high voltage semiconductor device without a floating ring structure. In this example, the horizontal axis represents the source to drain voltage, while the vertical axis represents the drain current of the semiconductor device during off-state.

In this example, each high voltage device comprises a substantially similar off-state breakdown voltage. Also, both the device with the floating ring structure and the device without the floating ring structure can achieve a similar on-state resistance. This graph illustrates that the semiconductor device with the floating ring structure can achieve a substantially similar on-state resistance as a similar semiconductor device without the floating ring structure.

Figure 3:
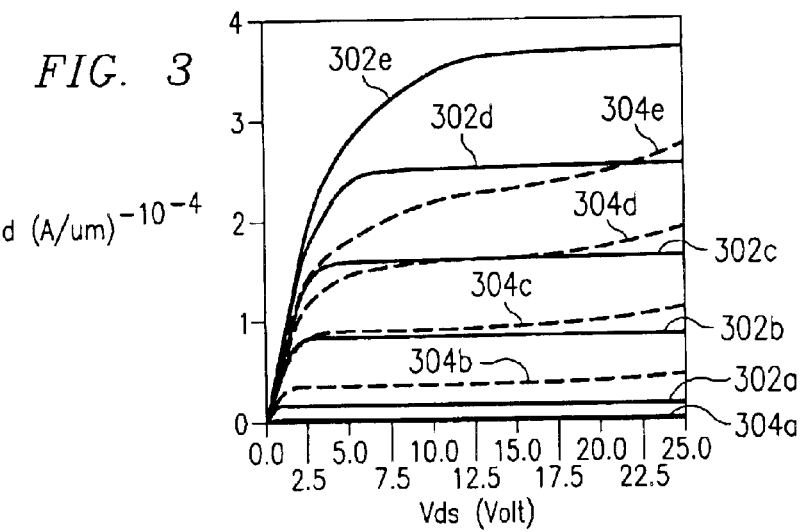
FIG. 3 is a graph comparing current response characteristics between a high voltage semiconductor device with a floating ring structure and a high voltage semiconductor device without a floating ring structure.

FIG. 3 is a graph comparing current response characteristics between a high voltage semiconductor device with a floating ring structure and a high voltage semiconductor device without a floating ring structure. In this example, lines 302A–302E represent the response to a high voltage semiconductor device with a floating ring structure. Lines 304A–304E represent the response of a high voltage semiconductor device without a floating ring structure. In this example, the horizontal axis represents the drain voltage, while the vertical axis represents the device current. In this example, the gate voltage is adjusted from zero (0) to five (5) volts in one (1) volt increments for each device. For example, line 302A represents the device response of the high voltage semiconductor device with a floating ring structure at a gate voltage of 1 volt.

This graph illustrates that the high voltage semiconductor device with a floating ring structure is capable of achieving a higher current flow through the semiconductor device for each change in gate voltage. For example, where the gate voltage and the drain voltage comprise 3 volts and 15 volts, respectively, the high voltage semiconductor device with the floating ring structure is capable of achieving a current flow through the device that is approximately $0.75 \times 10^{-4}$ amps/micron higher than the device without the floating ring structure. In addition, the current flow through the device with the floating ring structure is relatively stable over the range of source to drain voltages, when compared to the current flow through the semiconductor device without the floating ring structure.

Figure 4A:
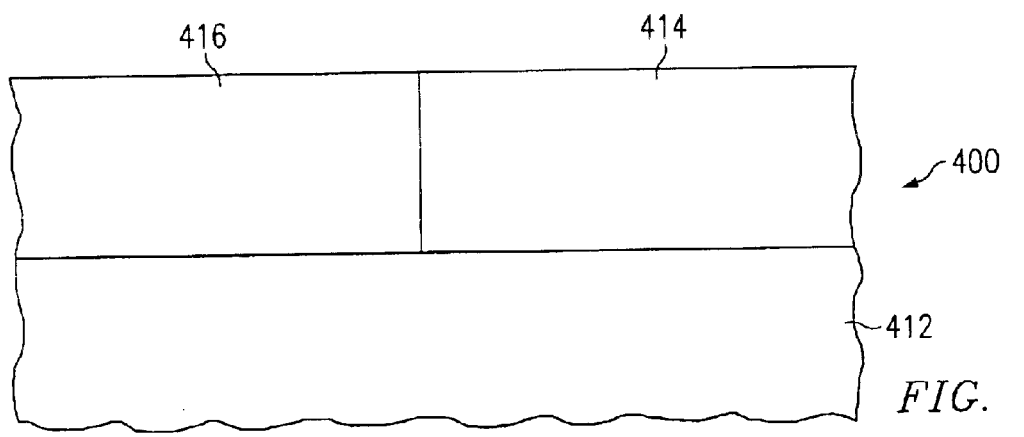
FIGS. 4A through 4D are cross-sectional views showing one example of a method of forming a portion of the semiconductor device illustrated in FIG. 1.
Figure 4B:
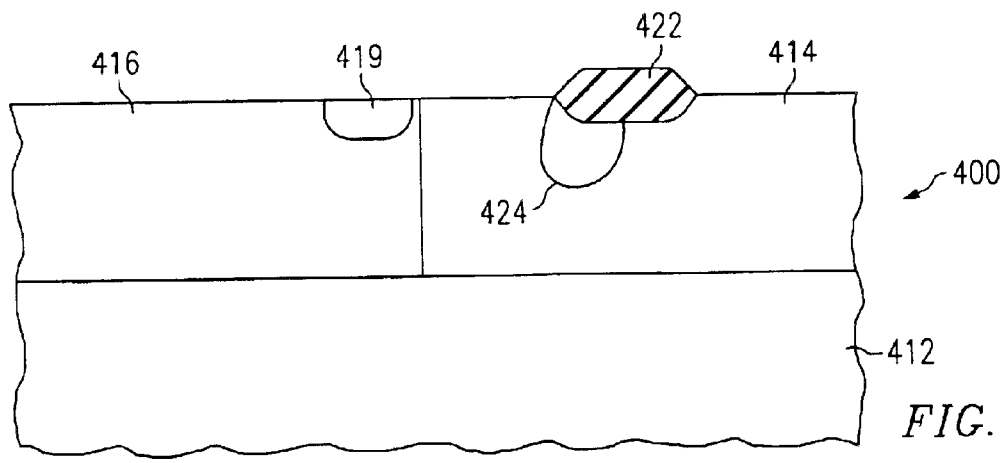
Figure 4C:
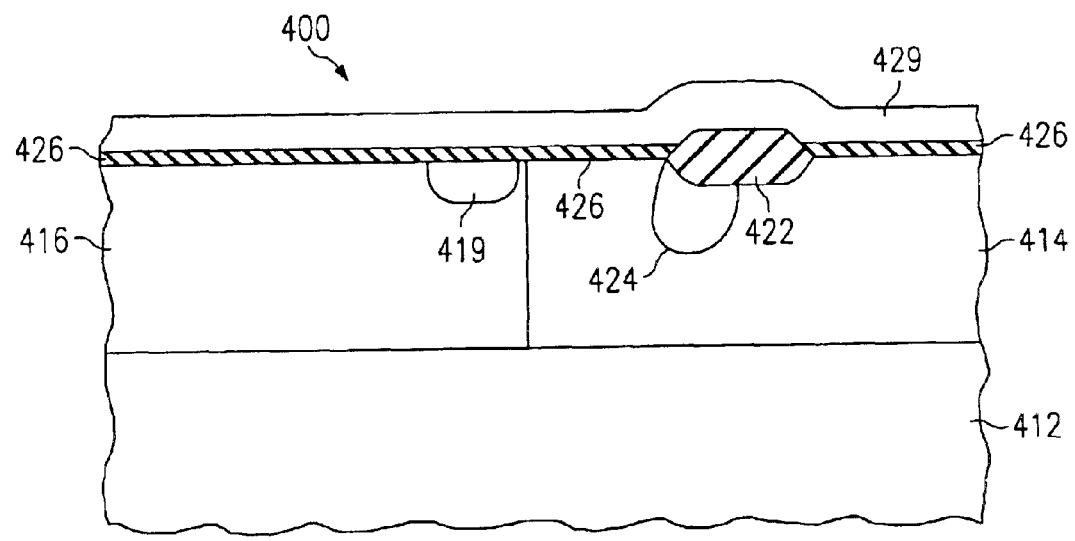

FIGS. 4A through 4D are cross-sectional views showing one example of a method of forming a portion of semiconductor device 10 of FIG. 1. Particular examples and dimensions specified throughout this document are intended for exemplary purposes only, and are not intended to limit the scope of the present disclosure. Moreover, the illustration in FIGS. 4A through 4C are not intended to be to scale.

FIG. 4A shows a cross-sectional view of a semiconductor device 400 after formation of a drain region 414 disposed within a semiconductor substrate 412 and after formation of a backgate region 416 disposed within semiconductor substrate 412. Semiconductor substrate 412 may comprise any suitable material used in semiconductor chip fabrication, such as silicon or germanium.

Drain region 414 and backgate region 416 may be formed, for example, by ion implantation and diffusion. In this particular example, drain region 414 comprises a negative-type (N-type) implant, while backgate region 416 comprises a positive-type (P-type) implant. In an alternative embodiment, drain region 414 may comprise a P-type implant, while backgate region 416 may comprise a N-type implant. In another embodiment (not explicitly shown), a sacrificial dielectric layer may be disposed prior to formation of drain region 414 and backgate region 416. In that case, regions 414 and 416 of semiconductor device 400 are doped by ion implantation through the sacrificial dielectric layer. Then, the sacrificial dielectric layer is removed.

FIG. 4B shows a cross-sectional view of semiconductor device 400 after formation of a field oxide layer 422 disposed outwardly from drain region 414, after formation of a floating ring structure 424 disposed inwardly from at least a portion of field oxide layer 422, and after formation of a channel region 419 disposed within at least a portion of backgate region 416. Field oxide layer 422 may comprise, for example, oxide, oxi-nitride, or silicon oxide. In this particular embodiment, field oxide layer 422 comprises silicon oxide with a thickness of approximately 3,000–6,000 angstroms.

Forming field oxide layer 422 may be effected through any of a variety of processes. For example, field oxide layer 422 can be formed by local oxidation on silicon (LOCOS), by using shallow trench isolation, by depositing, by using an inter-level dielectric, or by any other suitable process.

In this particular embodiment, channel region 419 comprises a P-type implant. In an alternative embodiment, channel region 419 may comprise an N-type implant. Forming channel region 419 may be effected through any of a variety of processes, for example, by doping channel region 419 to adjust the threshold voltage of semiconductor device 400. This doping may comprise, for example, ion implantation and diffusion. In one particular example, channel region 419 is formed by a chain implant technique. The term "chain implant" refers to a doping technique that involves multiple implants of the same area. For example, a doping technique that implants channel region 419 three times, the first implant to adjust the threshold voltage ($V_t$), the second implant to substantially prevent punch-through and the third implant to form a channel stop within semiconductor device 400. In that example, the first and second implants are relatively low energy implants, while the third implant is a higher energy implant.

Floating ring structure 424 comprises an implant region that is substantially complementary to the implant of drain region 414. In other words, where drain region 414 comprises an N-type implant, floating ring structure 424 comprises a P-type implant. In this particular embodiment, floating ring structure 424 comprises a P-type implant with a width of approximately 0.4–0.8 microns and a depth of approximately 0.3–0.6 microns. In one particular example, floating ring structure 424 is aligned approximately edge on to field oxide layer 422. In some embodiments, floating ring structure 424 can be aligned within two levels of misalignment or better, for example, within one level of misalignment.

Floating ring structure 424 may be formed, for example, by ion implantation and diffusion. In one particular embodiment, floating ring structure 424 can be formed at approximately the same time as channel region 419. In that embodiment, formation of floating ring structure 424 occurs during the high energy implantation of the channel stop in channel region 419. The presence of field oxide layer 422 typically makes it desirable to use a high energy implantation to form floating ring structure 424 inwardly from at least a portion of field oxide layer 422, because some of the lower energy dopants may be masked by field oxide layer 422. Forming floating ring structure 424 and channel region 419 simultaneously is advantageous in reducing costs associated with the manufacturing process because there are no additional process steps required to form floating ring structure 424.

FIG. 4C shows a cross-sectional view of semiconductor device 400 after formation of a gate oxide layer 426 outwardly from substrate 412 and after formation of a gate semiconducting (or conducting) layer 429 outwardly from gate oxide layer 426. Although gate oxide layer 426 and gate semiconducting (or conducting) layer 429 are shown as being formed without interstitial layers between them, such interstitial layers could alternatively be formed without departing from the scope of the present disclosure. Gate oxide layer 426 may comprise, for example, oxide, oxi-nitride, or silicon oxide. In this particular embodiment, gate oxide layer 426 comprises silicon oxide with a thickness of approximately 40–500 angstroms.

Forming gate oxide layer 426 may be affected though any of a variety of processes. For example, gate oxide layer 426 can be formed by growing an oxide. Using a grown oxide as gate oxide layer 426 is advantageous in providing a mechanism for removing surface irregularities in semiconductor substrate 412.

Gate semiconducting (or conducting) layer 429 may comprise, for example, amorphous silicon or polysilicon. In this example, gate semiconducting (or conducting) layer 429 comprises polysilicon. In this particular embodiment, gate semiconducting (or conducting) layer 429 comprises polysilicon with a thickness of approximately 2,200–4,000 angstroms. Forming gate semiconducting (or conducting) layer 429 may be affected, for example, by depositing polysilicon.

Figure 4D:
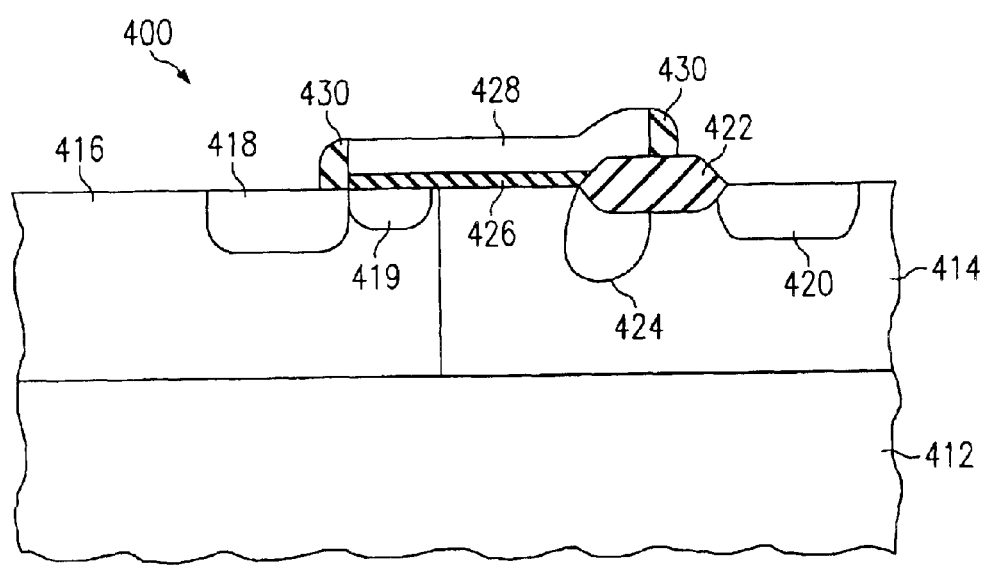

FIG. 4D shows a cross-sectional view of semiconductor device 400 after formation of semiconductor gate 428 outwardly from semiconductor substrate 412, after formation of spacer structures 430 outwardly from substrate 412, after formation of a source implant 418 within backgate region 416, and after formation of a drain implant 420 within drain region 414. Forming semiconductor gate 428 may be affected through any of a variety of processes. For example, semiconductor gate 428 can be formed by patterning and etching gate dieletric layer 429 and at least a portion of gate oxide layer 426 using photoresist mask and etch techniques.

Spacer structures 430 may comprise, for example, oxide, oxi-nitride, silicon oxide, nitride, or a combination of these or other dielectric materials. Forming spacer structures 430 may be affected, for example, by depositing a dielectric material outwardly from semiconductor substrate 412 and then etching it preferentially.

At some point, source implant 418 and drain implant 420 of semiconductor device 400 can be formed. Source implant 418 and drain implant 420 may be formed, for example, by ion implantation. Implants 418 and 420 may be formed, for example, after formation of spacer structures 430 and prior to removal of portions of gate oxide layer 426. In another embodiment, implants 418 and 420 may be formed after formation of spacer structures 430 and after removal of a least a portion of gate oxide layer 426. Portions of gate oxide layer 426 may be removed, for example, by patterning and etching the desired portions of gate oxide layer 426.

In an alternative embodiment, an isolation structure may be formed outwardly from backgate region 416 and a backgate implant may be formed within backgate region 416, as is shown in FIG. 1. The isolation structure can be located between source implant 418 and the backgate implant. Formation of the isolation structure can be substantially similar to the formation of field oxide layer 422 and can be done at the same time in the process sequence. Back gate implant comprises an implant that is substantially similar to the implant of backgate region 416. In other words, where backgate region 416 comprises a N-type implant, the backgate implant comprises a N-type implant. The backgate implant may be formed, for example, by ion implantation.

Although the present invention has been described in several embodiments, a myriad of changes, variations, alternations, transformations, and modifications may be suggested to one skilled in the art, and it is intended that the present invention encompass such changes, variations, alterations, alterations, transformations, and modifications as falling within the spirit and the scope of the appended claims.

What is claimed is:

1. A method of forming a semiconductor device, comprising:
    forming a drain region within a semiconductor substrate;
    forming a field oxide layer with a first edge disposed outwardly from the drain region;
    forming a floating ring structure with a second edge disposed inwardly from at least a portion of the field oxide layer wherein said first edge of said field oxide is aligned with said second edge of said floating ring structure; and
    wherein the floating ring structure comprises a first dopant type that is substantially complimentary to a second dopant type used to form the drain region.

2. The method of claim 1, wherein the first dopant type comprises primarily a negative-type dopant and the second dopant type comprises primarily a positive-type dopant.

3. The method of claim 1, wherein the first dopant type comprises primarily a positive-type dopant and the second dopant type comprises primarily a negative-type dopant.

4. The method of claim 1, wherein forming the field oxide layer comprises a technique selected from a group consisting of local oxidation of silicon and shallow trench isolation.

5. The method of claim 1, wherein the floating ring structure is aligned within two levels of misalignment.

6. The method of claim 1, wherein the floating ring structure is formed substantially simultaneously with a channel region of the semiconductor device.

7. The method of claim 1, further comprising:
    forming a backgate region within the semiconductor substrate; and
    forming a channel region within the backgate region of the semiconductor substrate, wherein the channel region comprises a substantially similar dopant type as the floating ring structure, and wherein forming the channel region comprises performing a chain implant.

* * * * *